(12) United States Patent
Nazarian et al.

(10) Patent No.: US 8,164,951 B2
(45) Date of Patent: *Apr. 24, 2012

(54) METHOD AND APPARATUS FOR PROVIDING A NON-VOLATILE MEMORY WITH REDUCED CELL CAPACITIVE COUPLING

(75) Inventors: Hagop A. Nazarian, San Jose, CA (US); Aaron Yip, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 3 days.

This patent is subject to a terminal disclaimer.

(21) Appl. No.: 12/818,565

(22) Filed: Jun. 18, 2010

(65) Prior Publication Data

US 2010/0302844 A1 Dec. 2, 2010

Related U.S. Application Data

(63) Continuation of application No. 11/437,706, filed on May 22, 2006, now Pat. No. 7,773,412.

(51) Int. Cl.
*G11C 16/04* (2006.01)
(52) U.S. Cl. ......... 365/185.02; 365/185.05; 365/185.17; 365/185.33
(58) Field of Classification Search .............. 365/185.17, 365/185.05, 185.02, 185.03, 185.33
See application file for complete search history.

(56) References Cited

U.S. PATENT DOCUMENTS

| | | | |
|---|---|---|---|
| 5,303,184 A | 4/1994 | Noda | |
| 5,396,451 A | 3/1995 | Ema | |
| 5,802,000 A | 9/1998 | Hamada | |
| 5,920,506 A | 7/1999 | Wang et al. | |
| 6,654,280 B2 | 11/2003 | Blodgett | |
| 6,816,408 B2 | 11/2004 | Blodgett | |
| 6,884,679 B2 | 4/2005 | Park et al. | |
| 6,956,768 B2 | 10/2005 | Hamilton et al. | |
| 7,307,889 B2 | 12/2007 | Takikawa et al. | |
| 7,411,822 B2 | 8/2008 | Specht et al. | |
| 7,773,412 B2 * | 8/2010 | Nazarian et al. | 365/185.02 |
| 2005/0199913 A1 | 9/2005 | Hofmann et al. | |

FOREIGN PATENT DOCUMENTS

| WO | WO 01/47019 A1 | 6/2001 |
|---|---|---|
| WO | WO 2004/102666 A1 | 11/2004 |

\* cited by examiner

*Primary Examiner* — Andrew Q Tran
(74) *Attorney, Agent, or Firm* — Dickstein Shapiro LLP (57) ABSTRACT

A flash memory architecture that provides a mechanism for reducing floating gate to floating gate coupling. The floating gates of the memory cells are shifted, either vertically or horizontally thereby offsetting the floating gates of the memory cells to an intervening space between the gates of adjacent memory cells. The shift of the floating gates decreases the floating gate to floating gate coupling.

9 Claims, 7 Drawing Sheets

METHOD AND APPARATUS FOR PROVIDING A NON-VOLATILE MEMORY WITH REDUCED CELL CAPACITIVE COUPLING

This application is a continuation of U.S. application Ser. No. 11/437,706, filed May 22, 2006 now U.S. Pat. No. 7,773,412, which is incorporated herein by reference in its entirety.

FIELD OF THE INVENTION

The invention relates to an architecture of a flash memory device, and more particularly, to an architecture for reducing floating gate to floating gate coupling.

BACKGROUND OF THE INVENTION

A non-volatile memory is a type of memory that retains stored data when power is removed. There are various types of nonvolatile memories including e.g., read only memories (ROMs), erasable programmable read only memories (EPROMs), and electrically erasable programmable read only memories (EEPROMs). One type of EEPROM device is a flash EEPROM device (also referred to as "flash memory").

Two common types of flash memory architectures are the "NAND" and "NOR" architectures, so called for the resemblance which the basic memory cell configuration of each architecture has to a basic NAND or NOR gate circuit, respectively. A NAND array architecture arranges its array of floating gate memory cells in a matrix such that the gates of each floating gate memory cell are connected by rows to word lines. However, each memory cell is not directly connected to a source line and a bit line. Instead, the memory cells of the array are arranged together in strings, typically of 8, 16, 32, or more, where the memory cells in the string are connected together in series, source to drain, between a common source line and a bit line. The NAND architecture floating gate memory array is accessed by a row decoder activating a row of floating gate memory cells by selecting the word line connected to their gates. In addition, the word lines connected to the gates of the unselected memory cells of each string are also driven. However, the unselected memory cells of each string are typically driven by a higher gate voltage so as to operate them as pass transistors, allowing them to pass current in a manner that is unrestricted by their stored data values. Current then flows from the source line to the bit line through each floating gate memory cell of the connected string, restricted only by the memory cells of each string that are selected to be read. Thereby, the current encoded stored data values of the row of selected memory cells are placed on the bit lines.

Generally, in a flash memory device, a charged floating gate represents one logic state, e.g., a logic "0", while a non-charged floating gate represents the opposite logic state e.g., a logic "1". However, in a multilevel cell, there are three charged logic states, e.g., "00", "01", "10", while a non-charged floating gate is represented by the logic state "11." A flash memory cell is programmed by placing the floating gate into one of these charged states. Charges may be injected or written onto the floating gate by any number of methods, including e.g., avalanche injection, channel injection, Fowler-Nordheim tunneling, and channel hot electron (CHE) injection. The floating gate may be discharged or erased by any number of methods including e.g., Fowler-Nordheim tunneling.

Programming of a flash memory device is typically achieved by biasing (by applying a series of pulses) the drain region to a first voltage, relative to the source region, and biasing the control gate to a second positive voltage which is greater than the first voltage. In the absence of any stored charge on the floating gate, this biasing causes the formation of an inversion-layer channel of electrons, between the source and drain regions. The larger positive bias on the control gate also establishes an electrical field in a tunneling oxide layer. This electric field attracts the electrons and accelerates them toward the floating gate, which is between the control gate and the channel region, by a process known as Fowler-Nordheim tunneling, The floating gate then accumulates and traps the accumulated charge.

The accumulation of a large quantity of trapped charge (electrons) on the floating gate will cause the effective threshold voltage of the field effect transistor comprising the source region, drain region, channel region and control gate to increase. If this increase is sufficiently large, the field effect transistor will remain in a nonconductive off state when a predetermined "read" voltage is applied to the control gate during a read operation. In the programmed state, the flash device may be said to be storing a logic 0 for a single cell flash memory device or logic 0, 01, 10 for a multilevel cell flash memory device. Once programmed, the flash device retains its higher threshold voltage even when its power supply is interrupted or turned off for long periods of time.

In flash memory devices, there is a coupling between the floating gates of neighboring memory cells (referred to as floating gate to floating gate coupling). When a voltage of a floating gate of a memory cell changes, for example to program a memory cell as described above, the voltages of the neighboring cells are also effected due to the coupling. When a memory cell (target cell) is programmed, the voltages of the neighboring memory cells change because the floating gates of its neighboring cells couple with the floating gate of the target cell. The voltage change of the neighboring cells may cause a cell to appear more or less programmed than it actually is, which is undesirable. Accordingly, there is a need and desire to reduce the floating gate to floating gate coupling experienced in today's flash memory devices.

BRIEF DESCRIPTION OF THE DRAWINGS

The advantages and features of embodiments of the invention will be more readily understood from the following detailed description of the invention provided below with reference to the accompanying drawings, in which.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention.

The exemplary embodiments of the invention provide flash memory cell architectures in which the floating gates of memory cells are offset to intervening space between gates of adjacent memory cells. The offset of the floating gates reduces the floating gate to floating gate coupling which occurs between adjacent memory cells.

Figure 1:
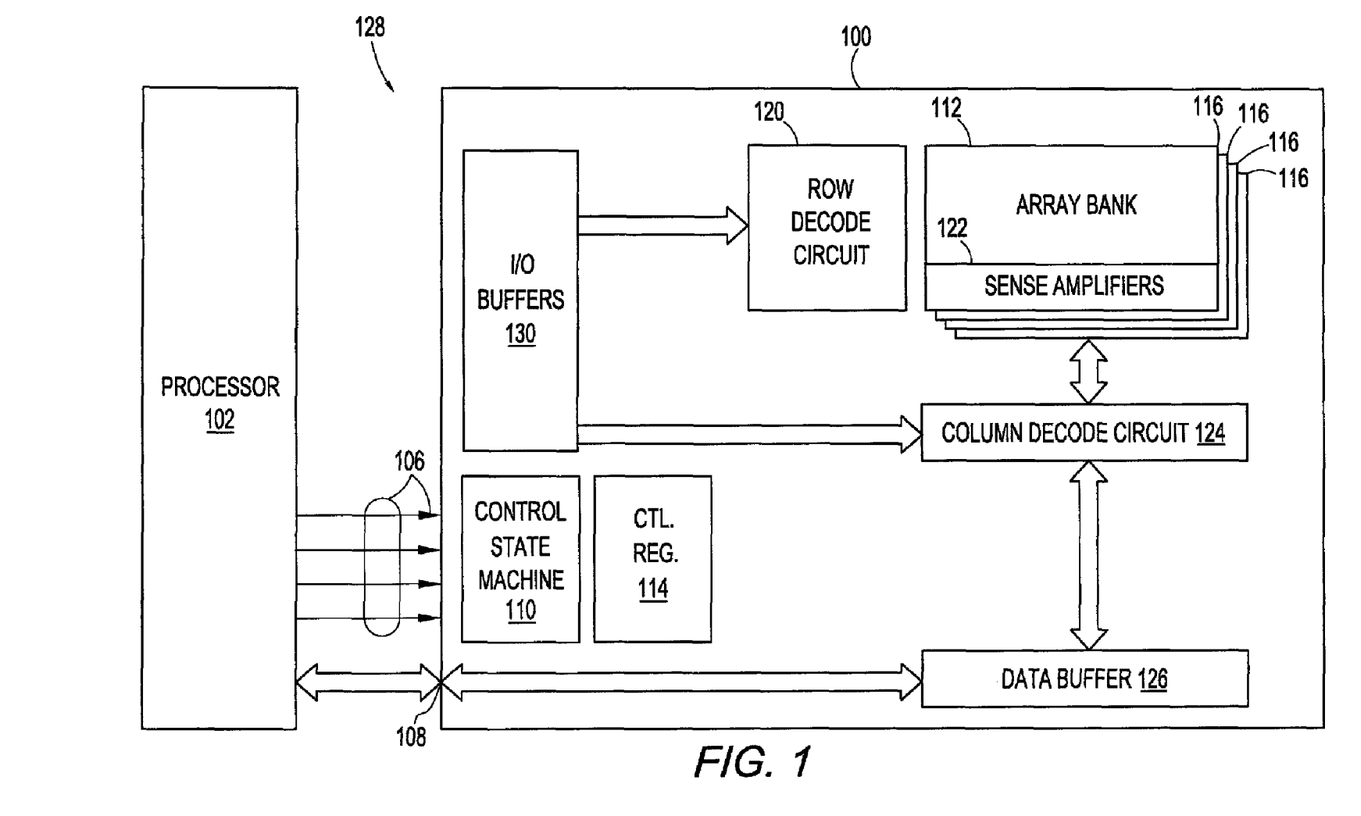
FIG. 1 illustrates an exemplary simplified block diagram of a system containing a flash memory device.

FIG. 1 illustrates an exemplary system 128 incorporating a flash memory device 100, fabricated on an integrated circuit, according to an exemplary embodiment of the present invention. The flash memory device 100 is connected to a host 102, which is typically a processor, other processing device or memory controller. The flash memory device 100 is connected to a control bus 106 and an address/data bus 108 that are each connected to the host 102 to allow memory read and write accesses. It is noted that in alternative embodiments, the address/data bus 108 can be divided into separate buses. Internal to the flash memory device 100, a control state machine 110 directs internal operations; manages the flash memory array 112 and updates RAM control registers and non-volatile erase block management registers 114. The registers 114 (which may include tables) are utilized by the control state machine 110 during operation of the flash memory device 100.

The flash memory array 112 contains a sequence of memory banks 116 or segments, each bank 116 being organized logically into a series of erase blocks. Memory access addresses are received on the address/data bus 108 and are divided into row and column address portions. On a read access, the row address is latched and decoded by row decode circuit 120, which selects and activates a row page of memory cells and the other memory cells in their associated strings across a selected memory bank and communicates with I/O buffers 130. The bit values encoded in the output of the selected row of memory cells are connected to a global bit line (not shown) and detected by sense amplifiers 122 associated with the memory bank. The column address for the access is latched and decoded by the column decode circuit 124, which communicates with I/O buffers 130. The output of the column decode circuit 124 selects the desired column data from the sense amplifier 122 outputs and is connected to the data buffer 126 for transfer from the memory device 100 through the address/data bus 108. On a write access, the row decode circuit 120 selects the row page and the column decode circuit 124 selects the write sense amplifiers 122. Data values to be written are connected from the data buffer 126 to the write sense amplifiers 122 selected by the column decode circuit 124 and are then written to the selected floating gate memory cells of the memory array 112. The written memory cells are then reselected by the row and column decode circuits 120, 124 and sense amplifiers 122 so that they can be read to verify that the correct values have been programmed into the selected memory cells.

Figure 2:
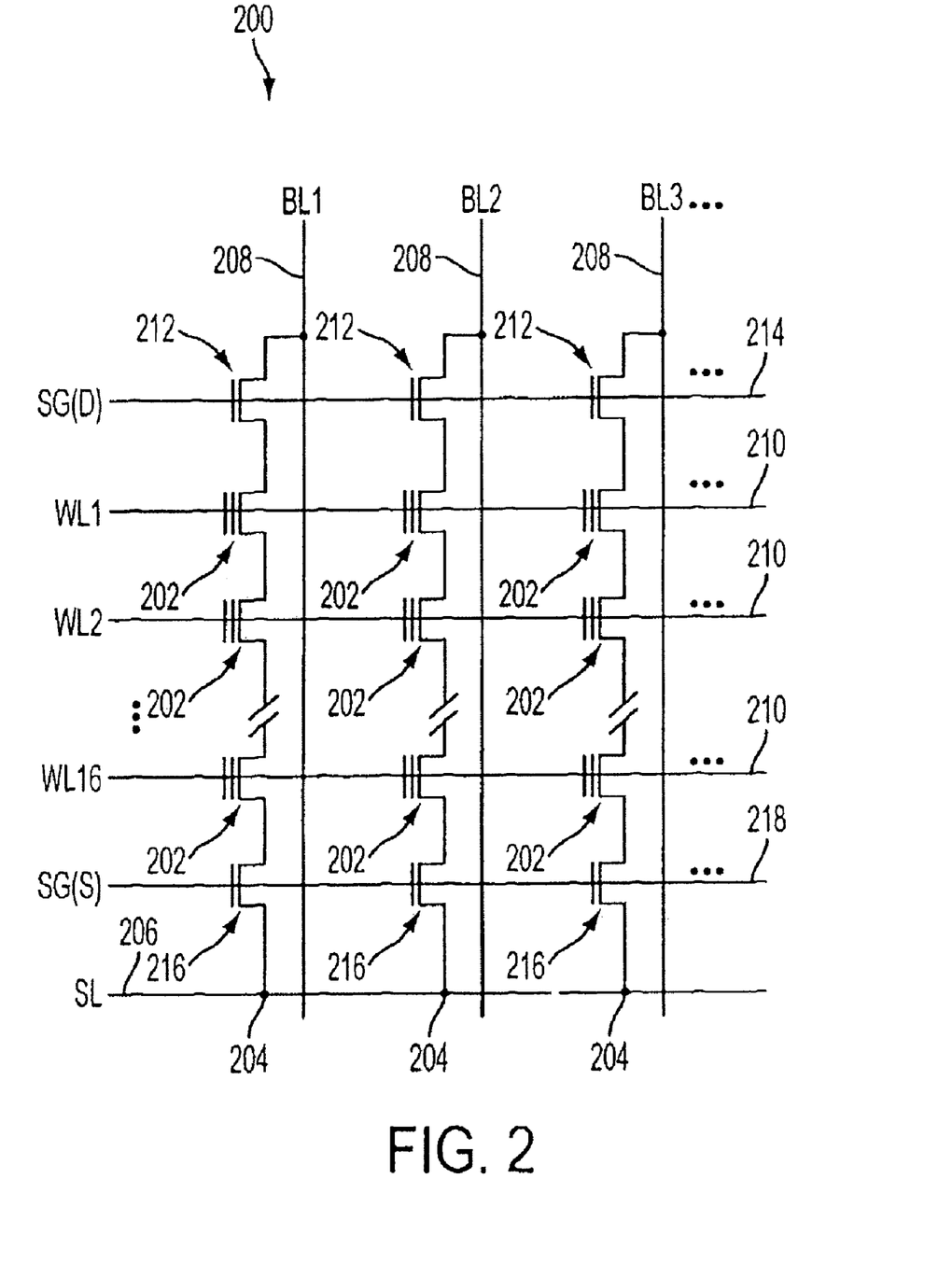
FIG. 2 illustrates an exemplary view of a memory array structure in a NAND type flash memory device.

FIG. 2 shows an exemplary schematic diagram of a NAND flash memory array 200. Embodiments of the invention may be implemented on a NAND flash memory array 200, among others, but it should be appreciated that the description of the embodiment using NAND flash memory should not be considered limiting. For example, the embodiments described herein may similarly be implemented in a NOR or other type of flash memory device.

The NAND flash memory array 200 comprises a sequence of floating gate memory cell strings 204. Each floating gate memory cell string 204 contains a plurality of, for example, sixteen, NMOS floating gate memory cells 202 that are connected drain to source in a series chain. Word lines (WL1-WL16) 210 that span across multiple strings 204 are connected to the control gates of every floating gate memory cell 202 to control their operation. In operation, a particular word line 210 selects the individual floating gate memory cell 202 in the string 204 to be written to or read from, while the other word lines operate the remaining floating gate memory cells 202 in the string 204 in the pass through mode. Each string 204 of floating gate memory cells 202 are connected to a source line (SL) 206 by a source select gate 216 and to a respective bit line (BL1-BLN) 208 by a drain select gate 212. The source select gates 216 are controlled by a source select gate control line (SG(S)) 218 connected to their control gates. The drain select gates 212 are controlled by a drain select gate control line (SG(D)) 214.

Floating gate to floating gate coupling is becoming a dominant problem in flash technology as memory density increases. In addition, the problems caused by floating gate to floating gate coupling further increase when the nonvolatile floating gate cells are used as multilevel cells storing a plurality of bits of information. Floating gate to floating gate coupling is the effect in which the change in the voltage of a floating gate of a memory cell results in a voltage change of neighboring memory cells' floating gates. The further away the neighboring cell is from the target cell, the less the effect the voltage shift of the target cell will have on the voltages of the neighboring cells. The amount of induced change in the neighboring cell(s) is described in terms of the coupling ratio. The induced change in voltage of a neighboring cell(s) is equal to the floating gate to floating gate coupling ratio multiplied by the voltage change of the target memory cell. The effect of the floating gate to floating gate coupling will occur regardless of whether the effected neighboring cell is programmed or not.

Figure 3:
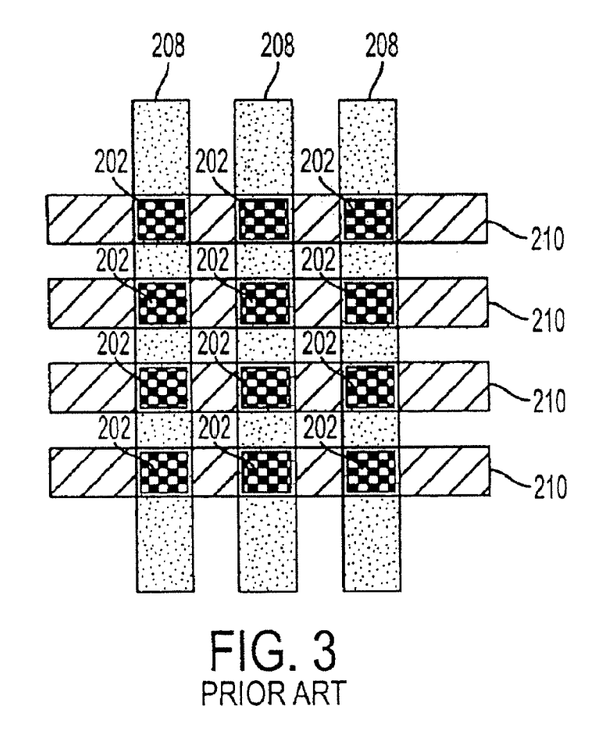
FIG. 3 illustrates an exemplary layout of a conventional flash memory device.

FIG. 3 illustrates the traditional architecture of a flash memory device. The memory cells 202 of the device are lined up in the word 210 and bit line 208 directions (i.e., they are orthogonally aligned with respect to each other). In an exemplary embodiment of the invention, the effect of floating gate to floating gate coupling may be reduced by shifting floating gates associated with every other word or bit line, for example, such that the floating gate side walls are not vertically and/or horizontally aligned, creating a shifted memory cell pattern. This results in a reduction in the effective coupling capacitance of a floating gates, which in turn reduces the unintended voltage shift of the neighboring memory cells. In accordance with embodiments of the invention, some of the floating gates of the memory cells 202 are shifted along the word 210 or bit lines 208, also creating a shifted memory cell pattern, to reduce the floating gate to floating gate coupling of neighboring memory cells 202.

FIGS. 4A-E illustrate exemplary layouts of a flash memory device according to exemplary embodiments of the invention. Floating gate to floating gate coupling occurs between neighboring cells in both the vertical and horizontal directions, but is dramatically reduced due to the novel layout illustrated in FIGS. 4A-E. Although figures described and illustrated herein may discuss/illustrate either horizontal (word line) or vertical shifting (bit line) and/or coupling, the embodiments of the invention are not limited to the specific directions illustrated and discussed herein.

Figure 4A:
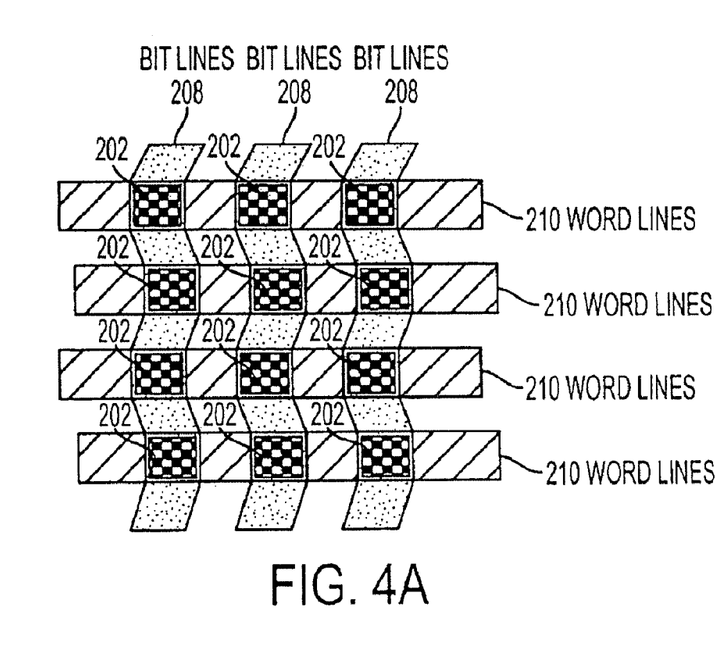
FIGS. 4A-E illustrate exemplary layouts of a flash memory device according to exemplary embodiments of the invention.
Figure 4B:
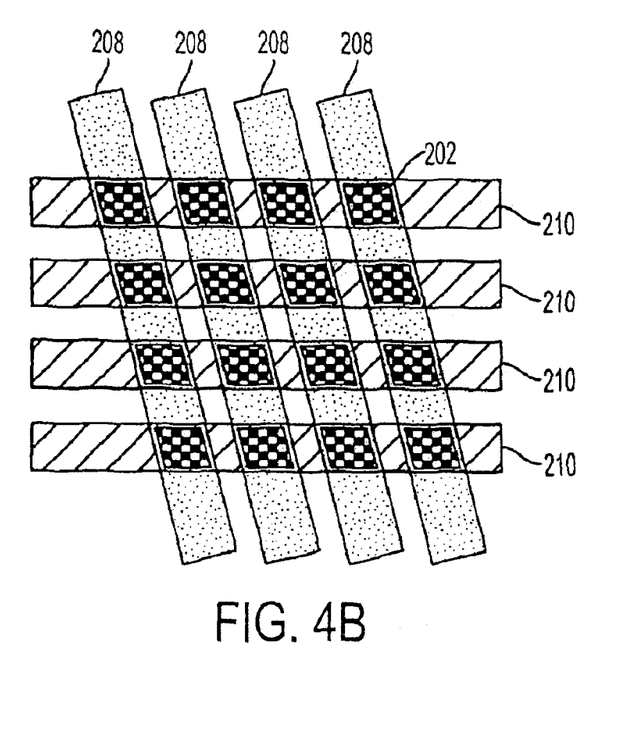
Figure 4C:
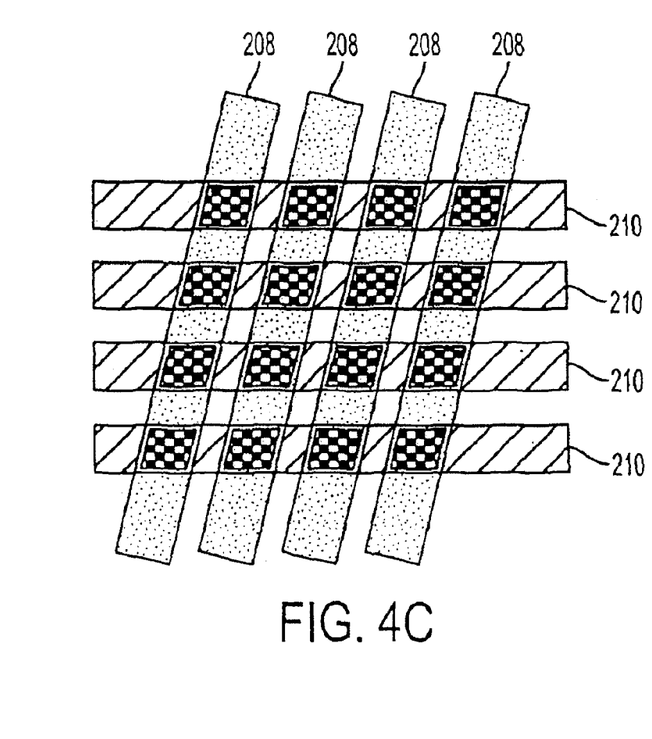
Figure 4D:
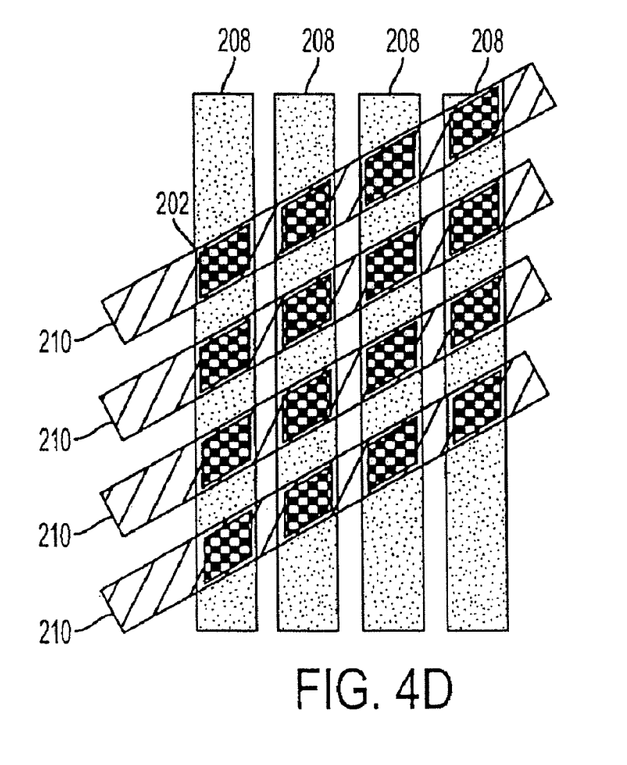
Figure 4E:
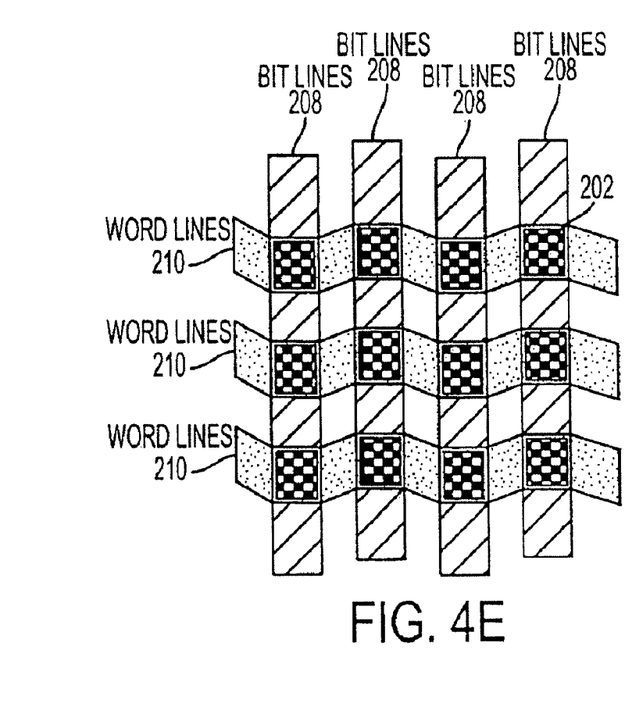

In FIG. 4A, the associated memory cells 202 in every other world line 210 are shifted horizontally to the right, relative to memory cells of other word lines, to decrease the proximity of the floating gates of the neighboring memory cells 202. The horizontal shifting in FIG. 4A leads to non linear bit lines 208 connecting the memory cells 202. In the exemplary embodiment of FIG. 4B, the memory cells 202 of the array are increasingly shifted horizontally to the right along the word lines 210 for successive word lines. The resulting shifted pattern includes bit lines 208 which are diagonally arranged with respect to the intersecting parallel word lines 210. The memory cells 202 in the word lines 210 illustrated in the exemplary embodiment of FIG. 4C are shifted horizontally in the opposite direction (i.e., to the left) in comparison to the shifts employed for the memory cells 202 in the word lines 210 of FIG. 4B. The resulting shifted pattern includes bit lines 208 which are again diagonally arranged with respect to the intersecting word lines 210 but which extend in a different direction from the bit lines 208 of FIG. 4B. The embodiments of the present invention are not limited to shifting the memory cells 202 horizontally along the word lines 210, but instead the memory cells 202 could be shifted vertically along the bit lines 208, as illustrated in FIG. 4D. In the exemplary embodiment of FIG. 4D, the memory cells 202 of the array are increasingly shifted vertically upward along the bit lines 210, though the memory cells 202 may also be increasingly shifted vertically downwards along the bit lines 210 as well. FIG. 4E illustrates another pattern, similar to FIG. 4A, but where the memory cells are shifted in alternative bit lines 208. Any layout which increases the distance between the memory cells 202 normally found in a traditional layout (FIG. 3) leads to the reduction of the floating gate to floating gate coupling of neighboring cells.

Figure 5:
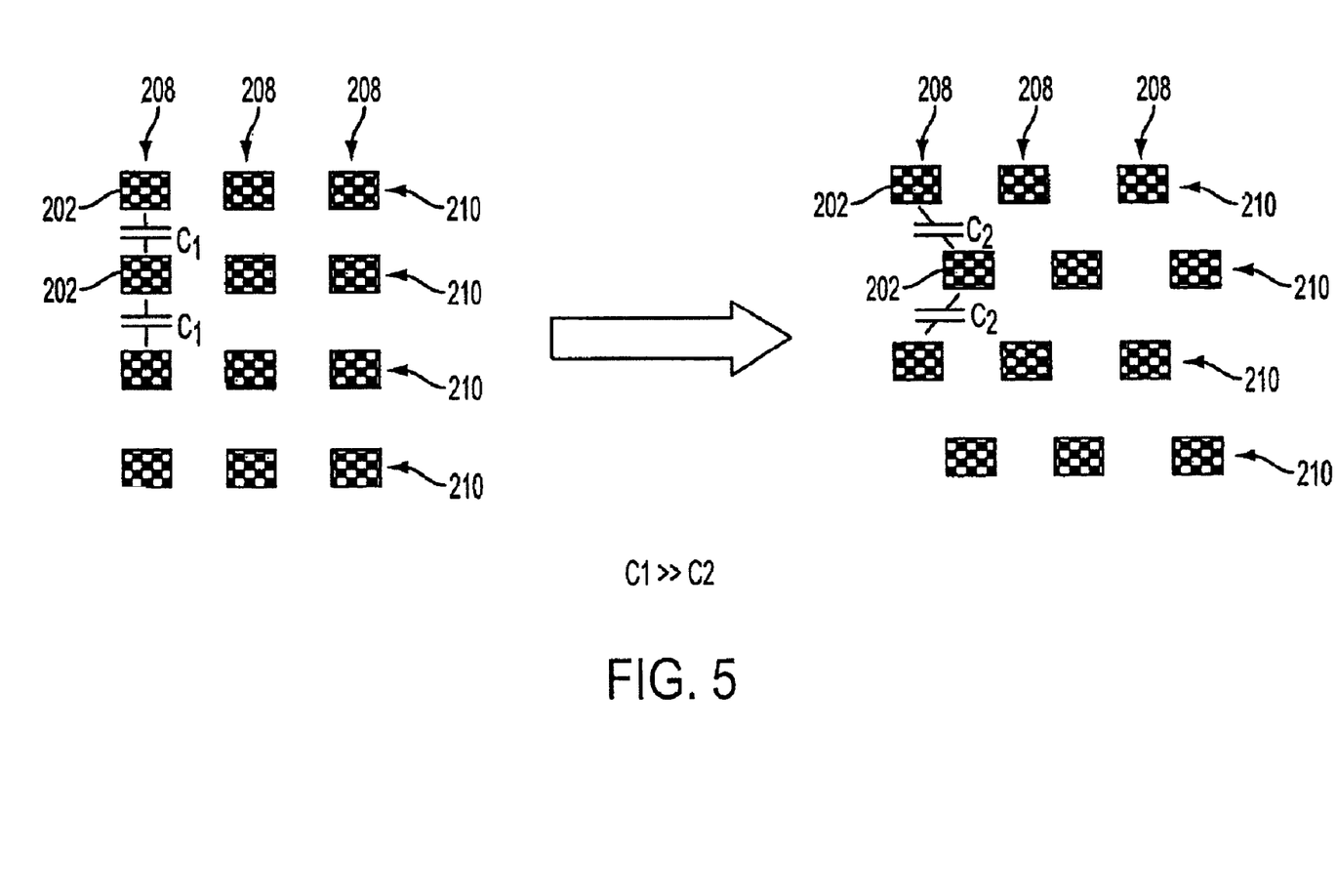
FIG. 5 illustrates the reduction in word line to word line capacitance of neighboring cells using an exemplary embodiment of the invention.

FIG. 5 illustrates exemplary capacitive coupling between floating gates of neighboring memory cells 202 along the same bit line. The coupling capacitances C1 between the memory cells 202 in the traditional linear layout are much greater than the capacitances C2 resulting in the exemplary embodiments of the invention. Although FIG. 5 illustrates only bit line 208 floating gate to floating gate coupling, coupling also occurs along the word lines 210, as previously noted. Furthermore, shifting the flash memory cells along the bit lines 208 is an exemplary embodiment of the invention to reduce the floating gate to floating gate coupling along the bit lines 208. One such exemplary embodiment is shown in FIG. 4D. Further, the embodiments of the invention are not limited to shifting memory cells only along the bit lines 208 or word lines 210.

Figure 6:
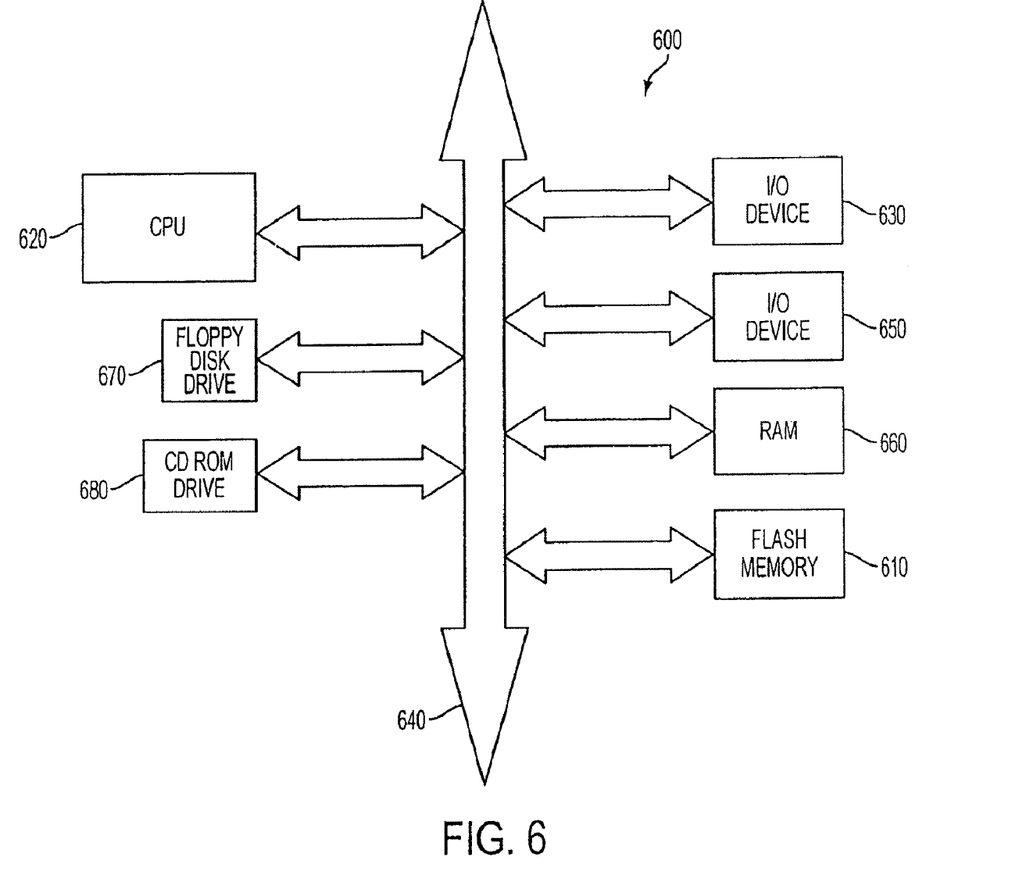
FIG. 6 illustrates a processor system incorporating a flash memory device constructed in accordance with an embodiment of the invention.

FIG. 6 is a block diagram of a processor system 600 utilizing a memory device, e.g., a flash memory device 610, constructed in accordance with an embodiment of the present invention. The processor system 600 may be a computer system, a process control system, camera system or any other system employing a processor and associated flash memory. The system 600 includes a central processing unit (CPU) 620, e.g., a microprocessor, that communicates with the flash memory device 610 and an I/O device 630 over a bus 640. It must be noted that the bus 640 may be a series of buses and bridges commonly used in a processor system, but for convenience purposes only, the bus 640 has been illustrated as a single bus. A second I/O device 650 is illustrated, but is not necessary to practice the invention. The processor system 600 may also include random access memory (RAM) device 660 and may include a read-only memory (ROM) device (not shown), and peripheral devices such as a floppy disk drive 670 and a compact disk (CD) ROM drive 680 that also communicate with the CPU 620 over the bus 640 as is well known in the art.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modification of the present invention that comes within the spirit and scope of the following claims should be considered part of the present invention.

What is claimed as new and desired to be protected by Letters Patent of the United States is:

1. A non-volatile memory device comprising:
   an array of non-volatile memory cells, each memory cell comprising a charge storage structure;
   a plurality of bit lines each connected to a plurality of memory cells in a string,
   a plurality of word lines each connected to the plurality of memory cells, wherein side walls of the charge storage structure of a first memory cell in a string are not vertically aligned with side walls of the charge storage structure of an adjacent memory cell in the string.

2. The non-volatile memory device of claim 1, wherein the non-volatile memory device is a flash memory device.

3. The non-volatile memory device of claim 1, wherein the charge storage structure comprises a floating gate.

4. The non-volatile memory device of claim 1, wherein the plurality of bit lines and corresponding memory cells are arranged so that the plurality of bit lines diagonally intersect with the plurality of word lines at corresponding memory cells.

5. The non-volatile memory device of claim 4, wherein the plurality of bit lines are nonlinear.

6. A non-volatile memory device comprising:
   an array of non-volatile memory cells, each memory cell comprising a charge storage structure;
   a plurality of bit lines each connected to a plurality of memory cells in a string,
   a plurality of word lines each connected to the plurality of memory cells, wherein side walls of each charge storage structure connected to a first word line are not horizontally aligned with side walls of each charge storage structure of each memory cell connected to a second word line, the first and second word lines being adjacent one another.

7. The non-volatile memory device of claim 6, wherein the plurality of bit lines are nonlinear.

8. The non-volatile memory device of claim 6, wherein charge storage structure comprises a floating gate.

9. The non-volatile memory device of claim 6, wherein the plurality of bit lines and corresponding memory cells are arranged so that the plurality of bit lines diagonally intersect with the plurality of word lines at corresponding memory cells.

* * * * *